United States Patent
Zubia et al.

(10) Patent No.: US 6,876,206 B2
(45) Date of Patent: Apr. 5, 2005

(54) AUTOMATIC JACK TESTER

(75) Inventors: Raul Zubia, CD. Juarez Chih. (MX); Javier Reyna, CD. Juarez Chih. (MX); Delfino Hernandez, CD. Juarez Chih. (MX); Genaro Neri, CD. Juarez Chih. (MX)

(73) Assignee: ADC Telecommunications, Inc., Eden Prairie, MN (US)

( * ) Notice: Subject to any disclaimer, the term of this patent is extended or adjusted under 35 U.S.C. 154(b) by 195 days.

(21) Appl. No.: 10/226,645

(22) Filed: Aug. 23, 2002

(65) Prior Publication Data

US 2004/0046569 A1 Mar. 11, 2004

(51) Int. Cl.[7] .......................... H01H 31/04; H01R 24/04
(52) U.S. Cl. ....................................... 324/538; 439/669
(58) Field of Search ................................ 324/538, 537, 324/500, 628, 722; 370/241, 244; 379/15.01; 439/42, 49, 188, 668, 669

(56) References Cited

U.S. PATENT DOCUMENTS

| | | | | |
|---|---|---|---|---|
| 4,232,262 A | * | 11/1980 | Emo et al. .................. | 324/722 |
| 4,646,299 A | * | 2/1987 | Schinabeck et al. ........ | 714/736 |
| 5,455,515 A | * | 10/1995 | Saijo et al. ................... | 324/538 |
| 5,877,622 A | * | 3/1999 | Aoyama et al. .......... | 324/158.1 |
| 6,373,259 B1 | * | 4/2002 | Daoud ......................... | 324/538 |
| 6,538,452 B2 | * | 3/2003 | Madsen et al. ............. | 324/538 |

OTHER PUBLICATIONS

Assembly Drawing: "JACK, DS3, MID RX, 3PORT, DSX–4R," *ADC Telecommunications*, 5 pgs. (May 16, 2000).
Assembly Drawing: "JACK, DS3, MID RX, 4PORT, DSX–4R," *ADC Telecommunications*, 4 pgs. (May 16, 2000).
Assembly Drawing: "JACK, DS3, MID RX, 6PORT, DSX–4R," *ADC Telecommunications*, 4 pgs. (May 16, 2000).

* cited by examiner

*Primary Examiner*—N. Le
*Assistant Examiner*—Hoai-An D. Nguyen
(74) *Attorney, Agent, or Firm*—Merchant & Gould P.C.

(57) ABSTRACT

A testing device for testing resistors of a telecommunications component, the testing device having a control system and an automatic test mechanism. The control system controls a test sequence performed by the automatic test mechanism. The testing device is programmed with a variety of selectable test sequences to automatically test and determine the resistive value and each individual resistor in a variety of telecommunication component arrangements.

24 Claims, 5 Drawing Sheets

AUTOMATIC JACK TESTER

TECHNICAL FIELD

The principles disclosed relate to a system for testing telecommunication components. More particularly, this disclosure concerns a testing device and system for testing the operability and functionality of telecommunication jacks.

BACKGROUND

In the telecommunications industry, modules having switching jacks for performing inter-connect and cross-connect functions are well known. An example of such is shown in U.S. Pat. No. 4,815,104 to Willams et al dated Mar. 21, 1989. With reference to FIG. 5 of the '104 Patent, two jacks 144 are mounted in the interior of a housing and permanently connected to cables 82, 84, 86, 88 which extend rearwardly from the jacks to connectors 74, 76, 78, 80 on a rear panel of the module housing.

The jacks used in inter-connect and cross-connect modules are well known switching jacks. In addition to those shown in U.S. Pat. No. 4,815,104, switching coax jacks are disclosed in U.S. Pat. No. 4,749,968 to Burroughs dated Jun. 7, 1988, U.S. Pat. No. 5,348,491 to Louwagie et al dated Sep. 20, 1994 and U.S. Pat. No. 5,246,378 to the Seiceanu dated Sep. 21, 1993. Both of the '491 and '378 patents teach jack modules which include not only switching components but monitor ports for permitting monitoring functions without signal interruption.

In U.S. Pat. No. 5,467,062 to Burroughs, a jack module 10 is received by a chassis 12. Jack module 10 mates with a rear interface 400. Rear interface 400 includes conductors 42, 43 which are electrically connected when a jack module 10 is not inserted within chassis 12.

Switching coax jacks are known which include center conductors which are divided into front and rear portions as shown in U.S. Pat. No. 5,885,096 to Ogren. The rear portions include movable springs to separate the rear portions 50, 52 from the front portions 42, 44. A V-shaped switching spring 70 connects the rear portions. Levers 90, 92 push the rear portions out of connection with the switching spring and into connection with the front portions upon insertion of plugs into forward ports of the jack.

Commonly owned U.S. patent application Ser. No. 08/808,086 concerns a module 10 with two removable front switching jacks 14, 14'. This allows replacement of the switching jacks, rather than the entire jack module to allow for upgrades for the switching jack or replacement of the jack in the event of failure of any one of the two switching jacks. Also, as telecommunications facilities are being developed, it is desirable to pre-cable and install modules without the need for having switching jacks present during the cabling. Then, when use of the module is desired including its switching jack function, the individual switching jacks can be added.

Typical switching jacks often include one or more resistors. To ensure the integrity of jacks, it is desirable to test the resistors after assembly of the jacks to insure that the resistors provide a predetermined amount of resistance. In the prior art, testing has been performed by manually inserting plugs into the jacks, and then testing the resistance provided by each of the resistors.

SUMMARY

One aspect of the present invention relates to testing device having a control system that controls a testing mechanism for automatically testing resistive elements of a telecommunications component. Another aspect of the present invention relates to a method of testing a telecommunications component including performing a selected test sequence wherein each resistive element of the telecommunications component is individually analyzed.

DETAILED DESCRIPTION

With reference now to the various figures in which identical elements are numbered identically throughout, a description of various exemplary aspects of the present invention will now be provided.

I. General Use

Figure 1:
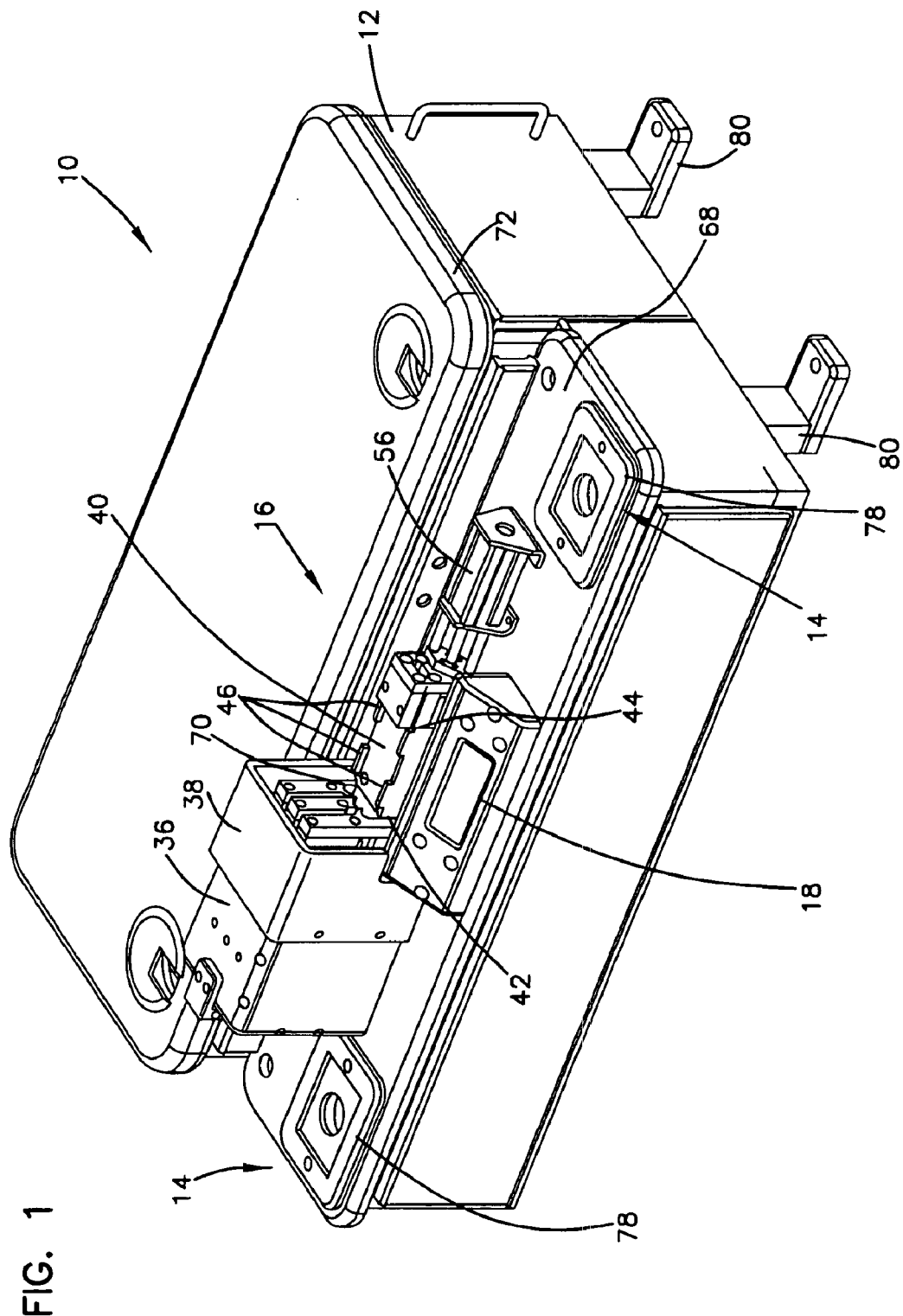
FIG. 1 is a front perspective view of one embodiment of a testing device according to the principles disclosed.

FIG. 1 illustrates one embodiment of a testing device 10 according to the principles of this disclosure. In general, the testing device 10 includes a housing 12, a control system 15 (shown schematically in FIG. 4), and a test mechanism assembly 16. The testing device 10 is used to test the operability of a telecommunications component, such as a jack 20 (shown in FIG. 2).

Figure 2:
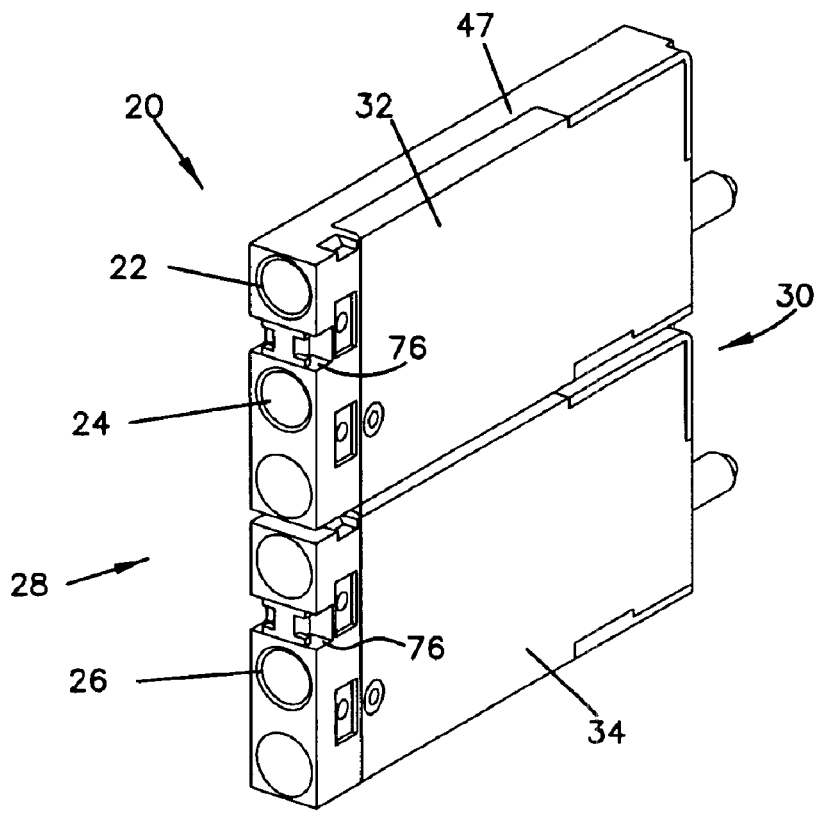
FIG. 2 is a front perspective view of one telecommunications component that may be tested by the testing device of FIG. 1.

The testing device 10 can test a variety of telecommunication components. The jack 20 illustrated in FIG. 2 is one example of the variety of components that can be tested by the disclosed device. In particular, the representative jack 20 is a 3-Port DSX-4R jack manufactured by ADC Telecommunications having modular units 32 and 34. The modular units 32 and 34 are removably mounted within a framework 47. The units are removed from the framework 47 and individually tested by the testing device 10, as hereinafter described.

Figure 3:
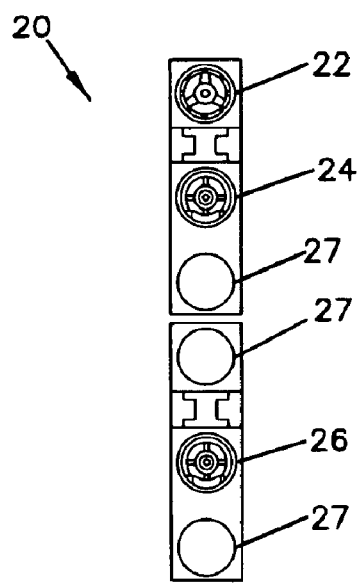
FIG. 3 is a front elevational view of the telecommunications component of FIG. 2.

As shown in FIGS. 2 and 3, each of the modular units 32 and 34 has three ports. The ports can be electrically configured in a variety of ways. For example, the upper modular unit 32 of the illustrated jack is configured with two operable ports 22 and 24 and one plugged port 27. The lower modular unit 34 is configured with one operable port 26 and two plugged ports 27. More specifically, the operable ports of the upper modular unit 32 are a MONITOR port 22 and an OUT port 24. The operable port of the lower modular unit 34 is an IN port 26.

The testing device 10 includes connectors or plugs 60, 62, 64 and 66 (shown schematically in FIG. 4) that are received within the operable ports to provide electrical connections with internal components of the jack. The arrangement of the jack 20 also includes a number of resistors. For example, the upper modular unit 32 schematically illustrated in FIG. 5 has a 93.1 ohm resistor, a 464 ohm resistor, and a 75 ohm resistor. The testing device 10 is designed to test the operability of each resistor. As will be discussed hereinafter, the testing device 10 can be used to test other types of jacks having other electrical arrangements.

II. Testing Device Structure

Referring back to FIG. 1, the housing 12 of the testing device 10 has an internal region (not shown), a work surface 68, and a cover 72. The internal region encloses the control system 15 and other electrical components that operate the testing device 10. Removing the cover 72 provides access to the internal region of the housing. The work surface 68 of the housing provides a mounting location for a display 18, a safety operation device 14, and the test mechanism assembly 16. The testing device 10 may also have feet 80 to secure the testing device to a worktable, for example, during testing operation. By this arrangement, the testing device 10 is self-contained and can be easily transported to various work stations in a manufacturing facility, for example, or be transported to other remote locations for testing purposes.

The test mechanism assembly 16 includes a base or bed 40 upon which a test unit (such as the modular unit 32 of the jack 20 illustrated in FIG. 2) is positioned. The test mechanism assembly 16 also includes three front cylinders 50, 52 and 54 (shown schematically in FIG. 4) and a rear cylinder 56. Actuation of the cylinders is controlled by corresponding valves 50', 52', 54' and 56'. Cover guards 36 and 38 cover the front cylinders 50, 52 and 54 and corresponding valves.

As shown at FIG. 1, the bed 40 has a first end 42, a second end 44 and guides 46 located between the first end 42 and the second end 44. The guides 46 assist in positioning a test unit 32 within the bed 40. The bed 40 also includes a positioning tab 70 corresponding to a slot 76 on the test unit 32. The positioning tab 70 assists in placing the test unit 32 in proper upward or downward orientation. When the test unit 32 is properly positioned within the bed 40, the front end 28 of the jack 20 faces toward the first end 42 of the bed 40, and accordingly, the rear end 30 of the jack 20 faces toward the second end 44 of the bed 40.

Figure 4:
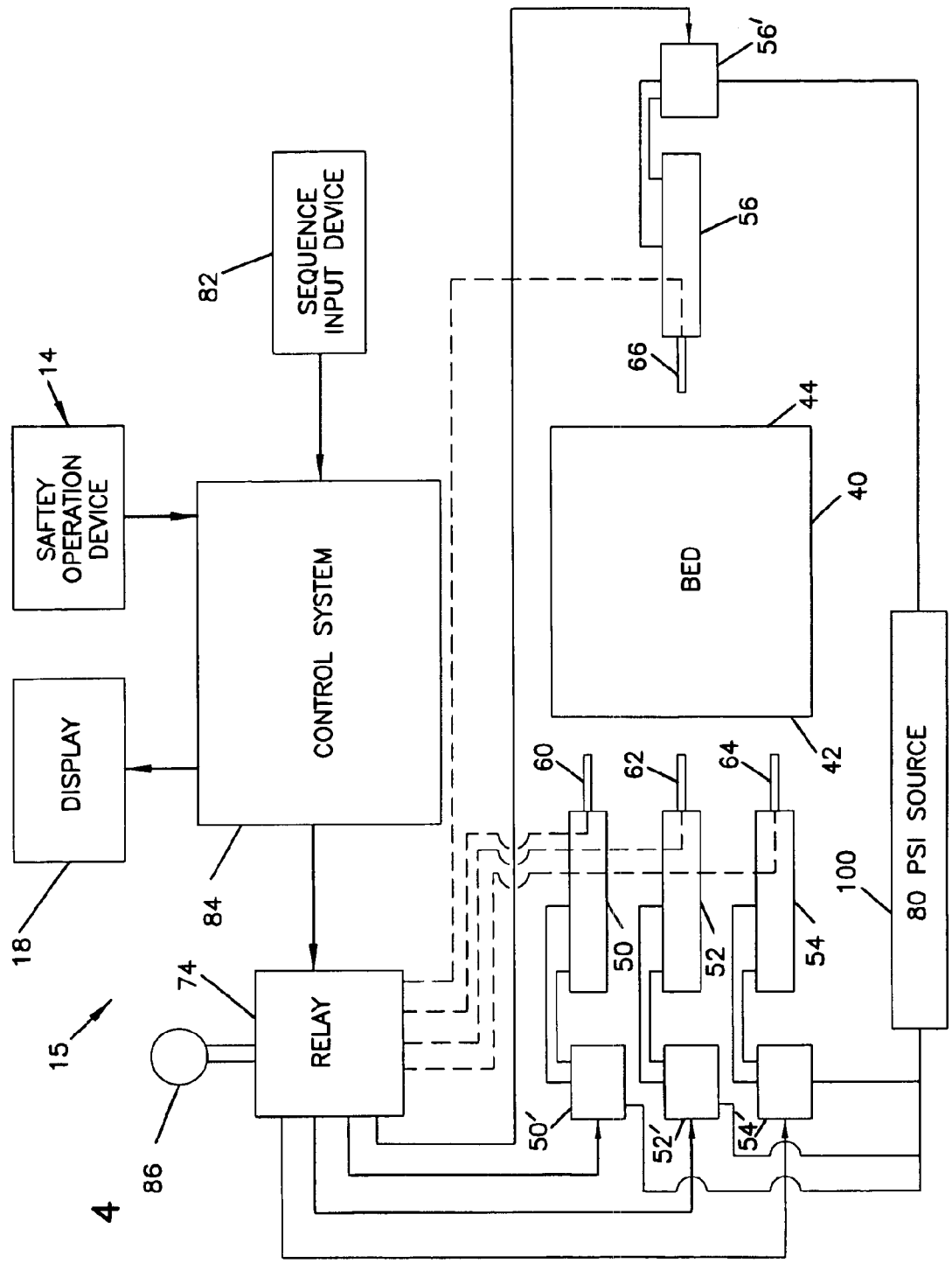
FIG. 4 is a schematic representation of the components and operating system of the testing device of FIG. 1.

Referring to FIG. 4, the front cylinders 50, 52 and 54 are located adjacent the first end 42 of the bed 40. These cylinders include front test plugs or connections 60, 62, and 64 (shown schematically in FIG. 4) that reciprocate in a direction toward the first end 42 of the bed when the cylinders are actuated. The front test plugs are arranged such that the plugs align with the ports of the test unit when the test unit positioned on the bed 40. In particular, the front test plugs 60, 62, 64 are designed to extend into the front ports of a test unit. In the representative test unit 32, the front test plugs 60 and 62 extend into the MONITOR port 22 and the OUT port 24, respectively, when the cylinders 50 and 52 are actuated.

The rear cylinder 56 is located adjacent the second end 44 of the bed 40. The rear cylinder 56 includes a rear test plug or connection 66 that reciprocates in a direction toward the second end 44 of the bed 40 when the rear cylinder 56 is actuated. The rear test plug 66 is arranged such that the rear plug aligns with a rear port (not shown) of the test unit when the test unit positioned on the bed 40. Specifically, the rear test plug 66 is designed to extend into the rear port of a test unit when the rear cylinder 56 is actuated.

In the preferred embodiment, the front and rear cylinders are pneumatic cylinders. Thus the housing 12 also includes a pneumatic port (not shown) at which a pressure source 100 (shown in FIG. 4), such as an airline, may be connected to provide air pressure to the cylinder actuating valves 50', 52', 54' and 56' and corresponding cylinders 50, 52, 54 and 56. The pneumatic cylinders illustrated operate at about 80 psi.

It is contemplated that other types of cylinders or devices adapted for engaging a test plug into a test unit can be used.

The test mechanism 16 of the present disclosure is automatic. What is meant by automatic is that actuation of the cylinders is controlled by the control system 15. As will be discussed in greater detail, an operator need only load or position the test unit onto the bed and select or input a desired test sequence. The test mechanism of the testing device thereafter operates automatically to sequentially test each resistive elements of the test unit.

III. Control System

The control system 15 of the testing device 10 is enclosed within the internal region of the housing. As shown in FIG. 4, the control system 15 includes a test sequence input device 82, a processor 84 and a relay 74.

The test sequence input device 82 is adapted so that an operator may select or enter a desired test sequence corresponding to the type of test unit (i.e. upper modular unit 32) being tested. The test sequence input device may comprise for example, a keyboard detachably connected to the control system 15 wherein the operator selects or enters a particular test sequence to be performed on the test unit via the keyboard. In the alternative, the test sequence input device may form part of the display 18, wherein the operator selects or enters the desired test sequence via a touch screen or a toggle button, for example. Buttons 78 interface with display to toggle between test options.

The relay 74 (shown schematically in FIG. 3) is enclosed within the internal region of the housing 12. The relay 74 is serially connected between the processor 84 and the system's mechanical components and comprises an analog to digital converter that converts communications transmitted between the plugs 60, 62, 64 and 66 and the processor 84. In the preferred embodiment, a 12-bit converter is used. The relay board also includes a relay matrix and an ohmmeter 86. The relay matrix and ohmmeter 86 cooperate to convert the voltage differential measured across a particular tested resistor into a data form that is processed by the processor 15.

The control system 15 electronically interacts with the display 18 and the safety operation device 14. The display 18 may be an LCD display or any other type of display or communication device adapted to communicate various messages from the control system 15 to the operator. The safety operation device 14 of the testing device is provided for purposes of safety. Specifically, the control system initiates operation of the test only upon receipt of a signal from the safety operation device 14 that a condition has been satisfied; the condition being that the operator has removed his hands from an area where injury could occur.

In the preferred embodiment, the safety operation device 14 includes two sensors 78 located a distance away from the base or bed 40 of the test mechanism assembly 16. The illustrated sensors are triggered by touch. The sensors may also include trigger mechanisms that operate by light. In testing operation, the user is required to place one hand on each of the sensors 78. Only when both sensors are triggered is the condition to begin testing satisfied. This ensures that the user has removed his hand or fingers from the bed location prior to actuating the cylinders to prevent injury. In accordance with the principles of this disclosure, other types of safety operation devices similarly requiring a user to remove his hands prior to operation may be used.

IV. Method of Testing a Telecommunications Component

Figure 5:
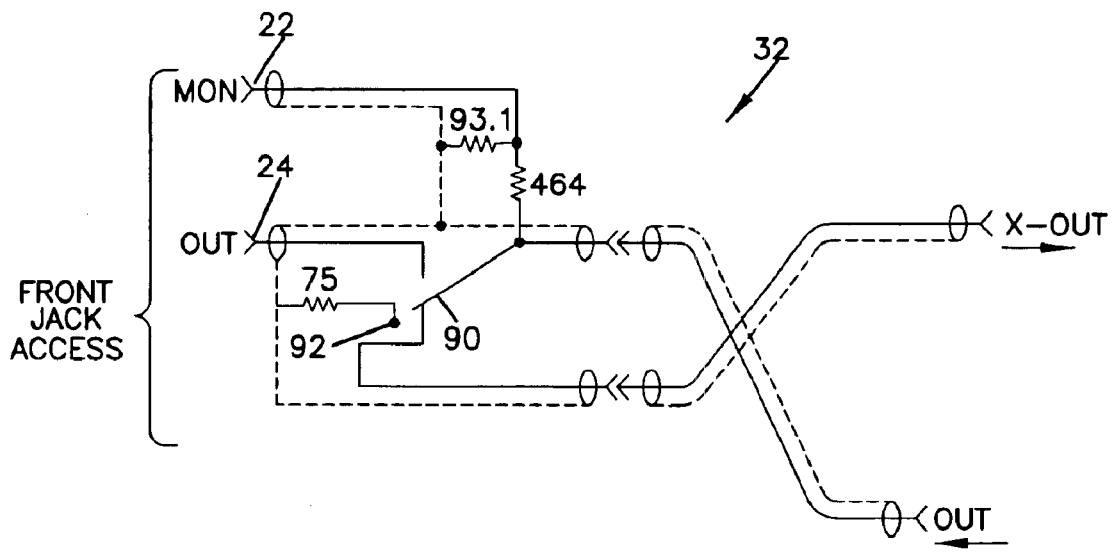
FIG. 5 is a schematic representation of a test module of the telecommunication component of FIG. 2, the schematic representation shown in a first state prior to testing.
Figure 6:
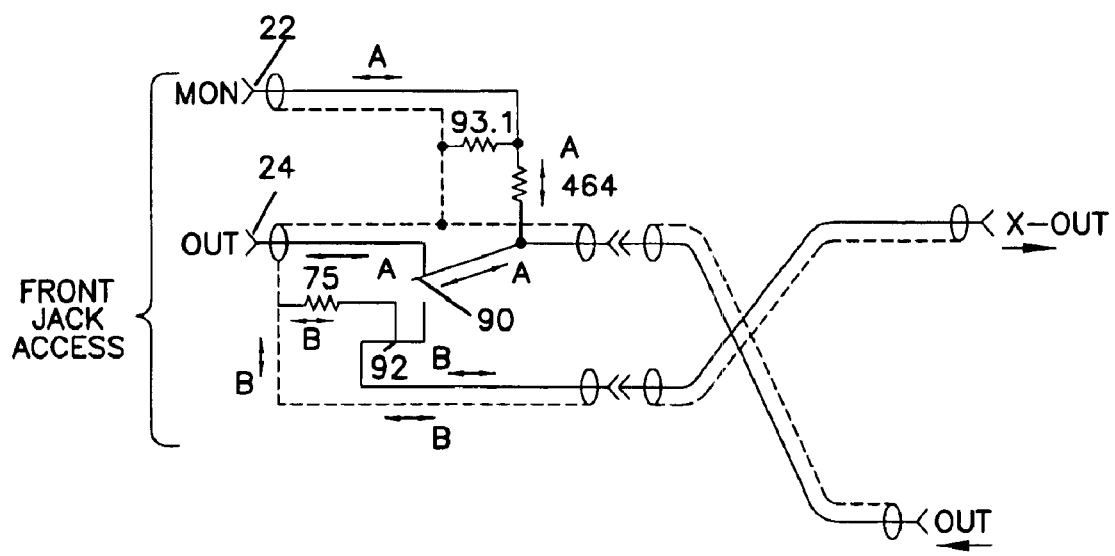
FIG. 6 is a schematic representation of the test module of FIG. 5 shown in a second state during testing.
Figure 7:
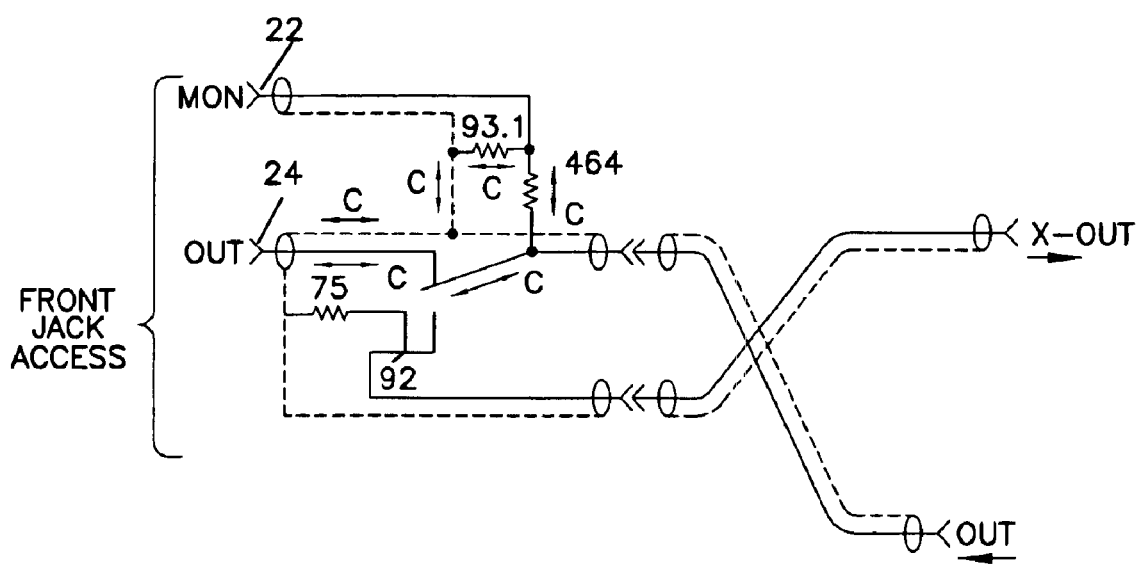
FIG. 7 is a schematic representation of the test module of FIG. 6 shown in a third state during testing.

For exemplary purposes, a test sequence is schematically illustrated in FIGS. 5–7. FIG. 5 represents the internal configuration of the test unit 32 in a first state prior to testing. The first state is the non-operative state or the electrical configuration of the modular unit when no plugs are inserted within either the front ports or the rear ports. As shown, the internal configuration includes a 93.1 ohm resistor, a 464 ohm resistor, and a 75 ohm resistor.

To begin, a test sequence corresponding to a particular test unit 32 is selected and/or entered into the control system 15 via the input device 82. The testing device may be programmed to confirm the type of test sequence selected upon the display 18. The test unit 32 is placed within the bed 40 of the testing device 10, assisted by guides 46 and the positioning tab 70. The processor 84 awaits a signal from the safety operation device 14 prior to initiating the test sequence. In the preferred embodiment, the safety operation device 14 requires the operator to place each hand on one of the sensors 78. When a condition corresponding to each sensor 78 has been satisfied, the control system 15 begins the sequence of testing. Preferably the control system 15 monitors the signal from the safety operation device 14 wherein, if the operator removes a hand from one of the sensors 78, testing ceases.

For the particular test unit 32 illustrated, the test sequence includes: testing the operability of each of the 464 ohm resistor, the 75 ohm resistor, and the 93.1 resistor. It is noted that the test sequence need not be performed in any particular order. Following is one test sequence example of many sequences that the testing device of this disclosure may be programmed to perform in testing each resistors in an arrangement.

For instance, a test sequence may begin by testing the 464 ohm resistor. One way to test the 464 ohm resistor begins with the control system 15 transmitting an electronic signal or command to the relay 74 to energize valves '50 and '52. When energized, the valves '50 and '52 switch open to pressurize and actuate cylinders 50 and 52. In actuating the cylinders, plugs 60 and 62 translate to extend into the MONITOR port 22 and the OUT port 24 of the test unit 32. This state or electrical configuration is schematically represented in FIG. 6.

Insertion of the test plug 62 into the OUT port 24 switches a contact 90 from a normal through connection (see FIG. 5 where an electrical circuit is defined between the X-OUT and OUT rear ports) to an OUT connection (see FIG. 6 where an electrical connection is made between the rear OUT port and the front OUT port 24). In the configuration of FIG. 6, circuit A (represented by arrows A) is provided between the MONITOR port 22 and the OUT port 24. To test the 465 ohm resistor, a current is generated and applied between the test plugs 60 and 62. The current travels the closed circuit A and provides a voltage across the 464 ohm resistor. The voltage differential across the 464 ohm resistor is measured by the ohmmeter 86. This measured value is analyzed by the processor 84 and compared against a range of predetermined values. The processor 84 determines a comparison result for the 464 ohm resistor.

In one embodiment, the control system may be programmed to determine whether the test continues or ceases based upon each individual comparison result. For example, if the measured value falls within a range of acceptable values, the test continues. A message may be displayed on the display 18 to inform the user of the test's progress. If the value is outside the range of acceptable values, the test ceases or terminates and a message indicating failure of the particular resistor may be displayed. This type of sequence is useful with telecommunication component that are not repairable or reworkable and will be scrapped upon detection of any failure. This saves in time and expense of continued testing where one faulty resistor has already been detected.

In the alternative, the comparison results of the entire test may be accumulated and displayed at the end of completing the entire testing sequence. This type of sequence may be useful with telecommunication components that are repairable, wherein the processor completes the test so that the operator can rework or repair all of the faulty resistors prior to subsequent re-testing.

The next sequence of testing in this example may be to test the 75 ohm resistor. One way to test the 75 ohm resistor begins with the control system 15 transmitting an electronic signal or command to the relay 74 to energize valve '56. When energized, the valve '56 opens to pressurize and actuate cylinder 56. In actuating cylinder 56, plug 66 translates to extend into the X-OUT rear port of the test unit 32.

The previous insertion of the test plug 62 into the OUT port 24 closed a contact 92 at a ground connection (see FIGS. 5 and 6). Because of the insertion of test plug 62 into the OUT port and the switching of contact 90, the 75 ohm resistor is isolated in a circuit B (represented by arrows B in FIG. 6) which extends from a center conductor of the X-OUT port to ground. A current is generated and applied to the circuit B. A voltage is provided across the 75 ohm resistor. The voltage differential across the 75 ohm resistor is measured by the ohmmeter 86. This measured value is analyzed by the processor 84 and compared against a range of predetermined values. As described above, the test may either continue or cease depending upon the particular test sequence program.

The 93.1 ohm resistor is evaluated to complete the test sequence in this test example. One way to test the 93.1 ohm resistor begins with the control system transmitting a command to the relay 74 to de-energize valves '50 and '56. This causes the front test plug 60 and the rear test plug 66 to retract form the MONITOR port and the rear port of the test unit 32. This state or electrical configuration is schematically represented in FIG. 7.

With only the test plug 62 inserted, a circuit C (represented by arrows C) is provided from a center conductor of the OUT port 24 to ground. In this configuration, the 93.1 ohm resistor and the 464 ohm resistor are in series. A voltage is provided across each of the resistors and a combined voltage differential across the 93.1 ohm resistor and the 464 ohm resistor is measured by the ohmmeter. This combined value is analyzed by the processor 84 to determine the voltage differential across only the 93.1 ohm resistor. In particular, the previously measured 464 ohm resistor value is used obtain the voltage differential across the 93.1 ohm resistor. This calculated value is compared against a range of predetermined values.

The above test sequence is only one sequence of many in which each of the resistors of the test unit 32 may be evaluated. It is contemplated that a variety of test sequences can be programmed to accomplish testing of each resistor of a test unit arrangement. Thus the versatility of testing device 10 permits an operator to test a wide variety of jacks having different electrical configurations.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A testing system for testing resistive elements of a jack, the jack having at least a front port on a front face of the jack and at least a rear port on a rear face of the jack, the testing system comprising:

a) a bed having a front end opposite a rear end, the bed being configured to hold the jack such that the front face of the jack is adjacent the front end of the bed and the rear face of the jack is adjacent the rear end of the bed;

b) an ohmmeter for measuring a voltage differential across the resistive elements;

c) a controller for analyzing the voltage differential measured by the ohmmeter;

d) a first cylinder having a first connection, the first cylinder being located adjacent the front end of the bed;

e) a second cylinder having a second connection, the second cylinder being located adjacent the rear end of the bed; and f) wherein the first connection is aligned to engage with the front port of the jack when the first cylinder is actuated by the controller and the second connection is aligned to engage with the rear port of the jack when the second cylinder is actuated by the controller.

2. The testing system of claim 1, wherein engagement of one of the first or second connections with one of the front or rear ports creates a voltage across a selected resistive element of the jack.

3. The testing system of claim 2, wherein the engagement of the one connection with the one port is controlled by the controller.

4. A testing system for testing resistive elements of a component, the system comprising:

a housing having a base, the base configured to support the component;

an automatic testing mechanism adapted to selectively provide a plurality of different electrical circuits when engaged with the component;

a measurement device that measures a voltage differential across a particular resistive element of the component when a current is applied to a selected one of the plurality of electrical circuits;

a processor that compares the voltage differential with a predetermined range of values and determines a comparison result; and wherein the processor further controls a test sequence of providing the different electrical circuits such that each of the resistive elements of the component is individually analyzed;

two sensors, wherein the processor initiates the test sequence when a signal is received from each of the sensors; and a display for displaying the comparison results.

5. The testing system of claim 4, wherein the automatic testing mechanism includes a plurality of cylinder-actuated plugs that operate independently of one another to engage with the component and provide the plurality of different electrical circuits.

6. The system of claim 4, wherein the processor is programmed to perform a plurality of test sequences for testing a plurality of different components having different resistive element arrangements, the processor selectively performing a particular test sequence in response to a component-type input.

7. A telecommunication component testing system for use in testing a resistive element of a telecommunication component, the system including:

a) a testing mechanism, the testing mechanism including:
   i) a measurement device for determining a measured value of the resistive element;
   ii) telecommunication plugs arranged to engage the telecommunication component; and
   iii) actuators that extend and retract the telecommunication plugs;

b) a processor connected to a display;

c) a relay serially connected between the testing mechanism and the processor for selectively operating the testing mechanism in response to a command from the processor; and d) two sensors;

e) wherein the processor begins testing when a signal is received from each of the two sensors, and wherein the processor analyzes the measured value from the measurement device to determine if the measured value is within a predetermined range, and displays the results of the test on the display.

8. The system of claim 7, wherein the processor is configured to test a plurality of different telecommunication components having different electrical arrangements, each different telecommunication component requiring a different test sequence, the processor selectively performing a particular test sequence in response to an input corresponding to a particular telecommunication component arrangement.

9. The system of claim 8, wherein the particular test sequence tests each of a plurality of resistive elements, each of the resistive elements having differing resistive properties.

10. The system of claim 7, wherein the processor ceases testing when the signal from either of the sensors terminates.

11. A testing device for testing a telecommunications unit having at least one resistor, the testing device comprising:

a) an enclosure having an exterior mounting surface;

b) a test mechanism coupled to the mounting surface of the enclosure, the test mechanism including:
   i) a base configured to retain the telecommunications unit in a fixed position during testing, the base having a front end and a rear end;
   ii) first testing plug located adjacent the front end of the base and a second testing plug located adjacent the rear end of the base, each of the first and second testing plugs being aligned such that the testing plugs correspond to ports of the telecommunications unit when positioned within the base; and
   iii) an actuation arrangement for independently actuating each of the testing plugs such that the plugs engage the ports of the telecommunications unit;

c) a control system that controls operation of the test mechanism, the control system including:
   i) a test sequence input device for selecting a particular test sequence from a plurality of test sequences that can be performed, the particular test sequence corresponding to the type of telecommunications unit being tested;
   ii) a processor adapted to analyze data and to control the particular test sequence;
   iii) a relay serially connected between the processor and the test mechanism; and
   iv) the control system applying a current across the resistor through the plugs such that a voltage differential can be measured;

d) an ohmmeter that measures the voltage differential across the resistor of the telecommunications unit, wherein the processor analyzes the voltage differential by comparing the voltage differential against a range of predetermined values and determines a result; and e) a display connected to the processor that displays the result.

12. The device of claim 11, furthering including a safety device adapted to generate a signal when a condition has been satisfied, wherein the control system initiates operation of the test mechanism upon receipt of the signal from the safety device.

13. The device of claim 11, wherein the actuation arrangement includes:
   a) a reciprocating cylinder connected to each plug; and
   b) a valve that actuates the cylinder to insert the plug within the corresponding port of the telecommunications unit.

14. The device of claim 11, wherein the relay includes an analog to digital connection and a relay matrix.

15. The device of claim 11, wherein the safety device comprises two sensors located a distance away from the test mechanism, the condition being satisfied when each of the two sensors has been simultaneously triggered.

16. A method of testing a plurality of telecommunications units each having at least one resistive elements, the method including:
   a) providing a test mechanism including a base and a plurality of testing components adjacent the base;
   b) providing a control system that controls operation of the test mechanism, the control system including a test sequence input device and a processor, the processor being adapted to analyze data and to control a selected test sequence;
   c) providing an ohmmeter that measures a voltage differential across the resistive elements of the telecommunications units;
   d) placing a first telecommunication unit upon the base of the test mechanism;
   e) selecting and entering the selected test sequence into the test sequence input device; and
   f) monitoring the control system's performance of the selected test sequence, the test sequence testing at least a first resistive element of the first telecommunications unit, the test sequence including:
      1) actuating a first number of the testing components to provide a first circuit configuration, wherein each of the testing components includes a valve configured to actuate a cylinder, the cylinder being coupled to a connection that engages with the telecommunications unit to provide the first circuit configuration;
      2) applying current to the first circuit configuration;
      3) measuring the voltage differential across the first resistive element of the telecommunications unit;
      4) comparing the voltage differential measurement to a first predetermined range of values and determining a first comparison result; and
      5) displaying the first comparison result on a display.

17. The method of claim 16, wherein the test sequence further includes testing a second resistive element of the first telecommunications unit by:
   1) modifying the first number of testing components actuated to provide a second circuit configuration;
   2) applying current to the second circuit configuration;
   3) measuring the voltage differential across the second resistive element of the first telecommunications unit;
   4) comparing the voltage differential measurement to a second predetermined range of values and determining a second comparison result; and
   5) displaying the second comparison result on the display.

18. The method of claim 17 wherein the testing of the second resistive element is performed automatically.

19. The method of claim 16, further including testing a second telecommunications unit, the method including:
   a) removing the first telecommunications unit from the base of the test mechanism;
   b) placing a second telecommunication unit upon the base of the test mechanism;
   c) selecting and entering a different selected test sequence into the test sequence input device; and
   d) monitoring the control system's performance of the different selected test sequence.

20. The method of claim 16, further including placing one hand on a first sensor and placing the other hand on a second sensor to initiate operation of the selected test sequence.

21. A testing device for testing a telecommunications unit having at least one resistor, the testing device comprising:
   a) an enclosure having an exterior mounting surface;
   b) a test mechanism coupled to the mounting surface of the enclosure, the test mechanism including:
      i) a base configured to retain the telecommunications unit in a fixed position during testing;
      ii) a plurality of testing plugs adjacent the base and aligned such that the test plugs correspond to ports of the telecommunications unit when positioned within the base; and
      iii) an actuation arrangement for independently actuating each of the testing plugs such that the plugs engage the ports of the telecommunications unit;
   c) a control system that controls operation of the test mechanism, the control system including:
      i) a test sequence input device for selecting a particular test sequence from a plurality of test sequences that can be performed, the particular test sequence corresponding to the type of telecommunications unit being tested;
      ii) a processor adapted to analyze data and to control the particular test sequence;
      iii) a relay serially connected between the processor and the test mechanism; and
      iv) the control system applying a current across the resistor through the plugs such that a voltage differential can be measured;
   d) an ohmmeter that measures the voltage differential across the resistor of the telecommunications unit, wherein the processor analyzes the voltage differential by comparing the voltage differential against a range of predetermined values and determines a result;
   e) a display connected to the processor that displays the result; and
   f) a safety device adapted to generate a signal when a condition has been satisfied, wherein the control system initiates operation of the test mechanism upon receipt of the signal from the safety device.

22. The device of claim 21, wherein the safety device comprises two sensors located a distance away from the test mechanism, the condition being satisfied when each of the two sensors has been simultaneously triggered.

23. A testing device for testing a telecommunications unit having at least one resistor, the testing device comprising:
   a) an enclosure having an exterior mounting surface;
   b) a test mechanism coupled to the mounting surface of the enclosure, the test mechanism including:
      i) a base configured to retain the telecommunications unit in a fixed position during testing;
      ii) a plurality of testing plugs adjacent the base and aligned such that the test plugs correspond to ports of the telecommunications unit when positioned within the base; and iii) an actuation arrangement for independently actuating each of the testing plugs such that the plugs engage the ports of the telecommunications unit, the actuation arrangement including:
1) a reciprocating cylinder connected to each plug; and
2) a valve that actuates the cylinder to insert the plug within the corresponding port of the telecommunications unit;
c) a control system that controls operation of the test mechanism, the control system including:
i) a test sequence input device for selecting a particular test sequence from a plurality of test sequences that can be performed, the particular test sequence corresponding to the type of telecommunications unit being tested;
ii) a processor adapted to analyze data and to control the particular test sequence;
iii) a relay serially connected between the processor and the test mechanism; and
iv) the control system applying a current across the resistor through the plugs such that a voltage differential can be measured;
d) an ohmmeter that measures the voltage differential across the resistor of the telecommunications unit, wherein the processor analyzes the voltage differential by comparing the voltage differential against a range of predetermined values and determines a result; and
e) a display connected to the processor that displays the result.

24. A method of testing a plurality of telecommunications units each having at least one resistive elements, the method including:

a) providing a test mechanism including a base and a plurality of testing components adjacent the base;
b) providing a control system that controls operation of the test mechanism, the control system including a test sequence input device and a processor, the processor being adapted to analyze data and to control a selected test sequence;
c) providing an ohmmeter that measures a voltage differential across the resistive elements of the telecommunications units;
d) placing a first telecommunication unit upon the base of the test mechanism;
e) selecting and entering the selected test sequence into the test sequence input device; and
f) placing one hand on a first sensor and placing the other hand on a second sensor to initiate operation of the selected test sequence;
g) monitoring the control system's performance of the selected test sequence, the test sequence testing at least a first resistive element of the first telecommunications unit, the test sequence including:
1) actuating a first number of the testing components to provide a first circuit configuration;
2) applying current to the first circuit configuration;
3) measuring the voltage differential across the first resistive element of the telecommunications unit;
4) comparing the voltage differential measurement to a first predetermined range of values and determining a first comparison result; and
5) displaying the first comparison result on a display.

* * * * *